US012811566B2

(12) United States Patent
Lin et al.

(10) Patent No.: US 12,811,566 B2
(45) Date of Patent: Nov. 24, 2026

(54) MIXED RADIO FREQUENCY FILTER WITH CAPACITORS AND RESONATORS

(71) Applicant: RichWave Technology Corp., Taipei City (TW)

(72) Inventors: Shih-Meng Lin, Taipei City (TW); Yu-Feng Yeh, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 43 days.

(21) Appl. No.: 18/969,307

(22) Filed: Dec. 5, 2024

(65) Prior Publication Data

US 2026/0135542 A1 May 14, 2026

(30) Foreign Application Priority Data

Nov. 8, 2024 (TW) ................................ 113142939

(51) Int. Cl.
*H03H 7/075* (2006.01)
*H03H 9/00* (2006.01)
*H03H 9/54* (2006.01)
*H03H 9/56* (2006.01)

(52) U.S. Cl.
CPC ............ *H03H 9/542* (2013.01); *H03H 7/075* (2013.01); *H03H 9/0014* (2013.01); *H03H 9/568* (2013.01)

(58) Field of Classification Search
CPC ...... H03H 9/0014; H03H 9/542; H03H 9/568; H03H 7/075
USPC .................................................. 333/186–193
See application file for complete search history.

(56) References Cited

U.S. PATENT DOCUMENTS 5,019,794 A * 5/1991 Letessier .................. H03H 7/12 333/175
8,552,818 B2 * 10/2013 Kadota ................ H03H 9/6483 333/195
2024/0356531 A1 10/2024 Shirakawa

FOREIGN PATENT DOCUMENTS

CN 107666299 A 2/2018
TW 202023189 A 6/2020

OTHER PUBLICATIONS

Office action mailed on Jul. 24, 2025 for the Taiwan application No. 113142939, filing date Nov. 8, 2024, p. 1-4, Jul. 24, 2025.

* cited by examiner

*Primary Examiner* — Rakesh B Patel
(74) *Attorney, Agent, or Firm* — Winston Hsu

(57) ABSTRACT

A mixed radio frequency filter includes a first transceiving terminal, a second transceiving terminal, a first series capacitor, a second series capacitor, a first series resonator, and a second series resonator. The first series capacitor, the first series resonator, the second series resonator, and the second series capacitor are coupled in series and in the order listed between the first transceiving terminal and the second transceiving terminal.

18 Claims, 2 Drawing Sheets

MIXED RADIO FREQUENCY FILTER WITH CAPACITORS AND RESONATORS

TECHNICAL FIELD

The present invention relates to a mixed radio frequency filter, and in particular to a mixed radio frequency filter including series capacitors and series resonators.

BACKGROUND

As the development of communication technology, mobile phones and wireless communication devices are supporting an increasing number of frequency bands to enhance signal coverage and international roaming capabilities. The rapid proliferation of wireless devices has led to a growing demand for small and lightweight filters.

Acoustic wave devices, including surface acoustic wave (SAW) and bulk acoustic wave (BAW) devices, are extensively utilized for converting and transmitting electrical and acoustic signals. These devices may be used in a wide range of applications. For instance, an acoustic wave device may function as filters to filter out noise, so as to preserve wireless signals within a specific frequency band. Acoustic wave devices are favored in various communication products due to their low transmission loss, excellent anti-electromagnetic interference performance, and compact size. Additionally, they may also be employed in resonators, transformers, sensors, etc.

For instance, a ladder-type radio frequency filter may incorporate a series resonator and a parallel resonator. Film Bulk Acoustic Resonators (FBARs) may be utilized to achieve desirable characteristics at high frequencies, such as an improved quality factor. In certain Wi-Fi applications, the radio frequency filter may be desired to exhibit an enhanced performance over a broader frequency range (e.g., 5.945 GHz-7.125 GHz). Consequently, there is a demand for a mixed radio frequency filter with advantageous characteristics both in higher frequencies and in wider frequency bands.

SUMMARY

In an embodiment, a mixed radio frequency filter includes a first transceiving terminal, a second transceiving terminal, a first series capacitor, a second series capacitor, a first series resonator, and a second series resonator. The first series capacitor, the first series resonator, the second series resonator, and the second series capacitor are coupled in series and in the order listed between the first transceiving terminal and the second transceiving terminal.

DETAILED DESCRIPTION

Figure 1:
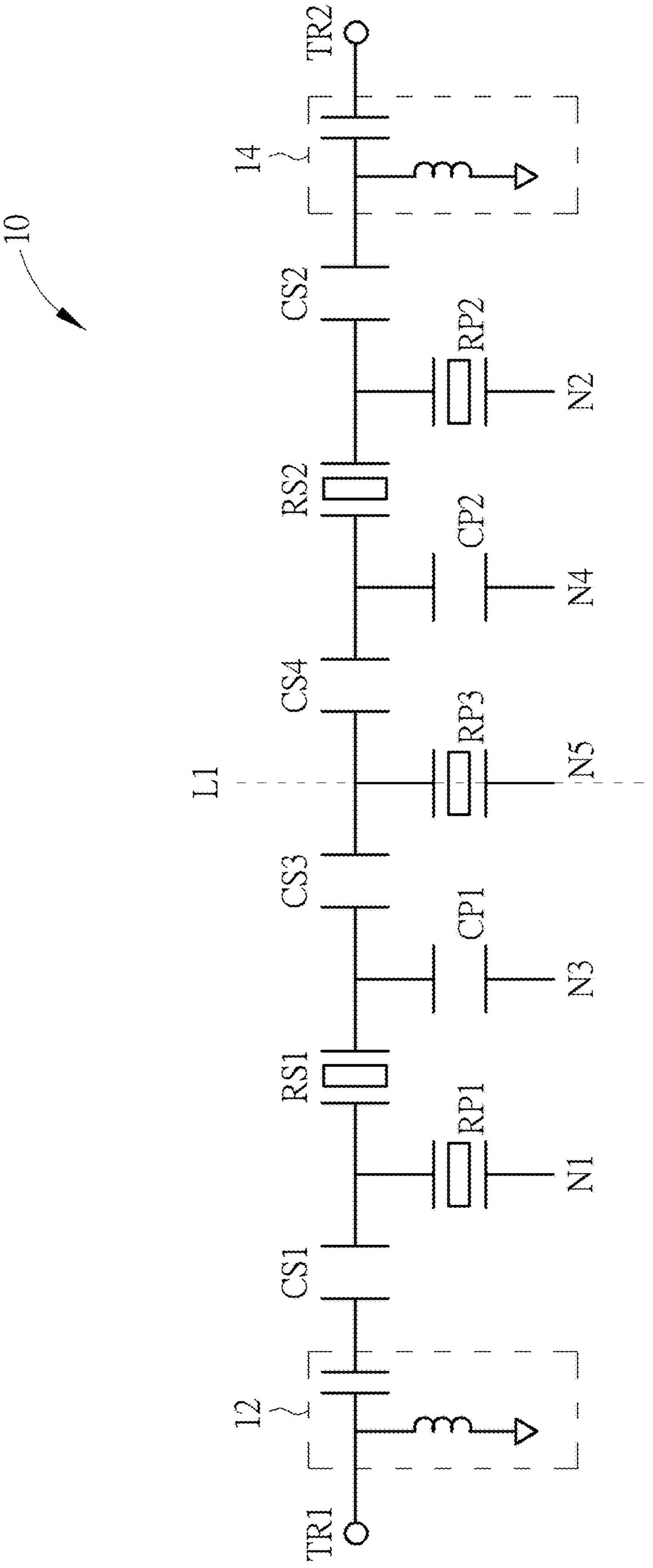
FIG. 1 is a circuit diagram of a mixed radio frequency filter according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts may be omitted for clarity, and like reference numerals refer to like elements throughout.

The present invention may be understood by referring to the following detailed description in conjunction with the accompanying drawings. It should be noted that, for clarity and conciseness, the drawings may only depict a portion of the electronic device, and certain elements may be not drawn to scale. Additionally, the number and size of components in the figures may be for illustrative purposes only and may be not intended to limit the scope of the invention. Components marked with the same symbols in the drawings have the same or similar properties or functions as described in the following context.

It should be noted that the following embodiments may be replaced, reorganized, and combined with features from various embodiments without departing from the spirit of the present invention. The features of each embodiment may be used individually or in combination, provided they do not violate the spirit of the invention. In the following description and claims, terms such as "include," "contain," and "have" may be open-ended and should be interpreted to mean "including but not limited to." Therefore, when these terms may be used in the description of the present invention, they indicate the presence of the corresponding features, regions, steps, operations, and/or components, but do not exclude the presence of additional features, regions, steps, operations, and/or components.

FIG. 1 is a circuit diagram of a mixed radio frequency filter 10 according to an embodiment of the present invention. As shown, in some embodiments, the mixed radio frequency filter 10 may include a first transceiving terminal TR1 and a second transceiving terminal TR2. The first transceiving terminal TR1 may be configured to receive an input radio frequency signal, and the second transceiving terminal TR2 may be configured to transmit an output radio frequency signal. The radio frequency signal may be transmitted from the first transceiving terminal TR1 to the second transceiving terminal TR2 and filtered by the mixed radio frequency filter 10, so as to retain signals within a specific frequency band. However, the present invention is not such limited, and in other embodiments, the second transceiving terminal TR2 may be configured to receive the input radio frequency signal, and the first transceiving terminal TR1 may be configured to transmit the output radio frequency signal. Additionally, the mixed radio frequency filter 10 may include a series path and a parallel path coupled between the first transceiving terminal TR1 and the second transceiving terminal TR2.

In some embodiments, the series path in the mixed radio frequency (RF) filter 10 may include a capacitor and a resonator coupled in series. As shown, the first series capacitor CS1 may be coupled to the first transceiving terminal TR1, and the first series resonator RS1 may be coupled to the first series capacitor CS1. Similarly, the second series capacitor CS2 may be coupled to the second transceiving terminal TR2, and the second series resonator RS2 may be coupled to the second series capacitor CS2. In other words, the first series capacitor CS1, the first series resonator RS1, the second series resonator RS2, and the second series capacitor CS2 may be serially coupled and in the order listed between the first transceiving terminal TR1 and the second transceiving terminal TR2.

In another embodiment, the series path in the mixed RF filter 10 may further include a third series capacitor CS3 and a fourth series capacitor CS4, which may be coupled between the first series resonator RS1 and the second series resonator RS2. Specifically, the first terminal of the third series capacitor CS3 may be coupled to the first series resonator RS1, and the second terminal of the third series capacitor CS3 may be coupled to the fourth series capacitor CS4. The first terminal of the fourth series capacitor CS4 may be coupled to the third series capacitor CS3, and the second terminal of the fourth series capacitor CS4 may be coupled to the second series resonator RS2.

In some embodiments, the parallel path in the mixed RF filter 10 may include capacitors and resonators. As shown, the parallel path may include a first parallel resonator RP1, which may couple the series path of the mixed RF filter 10 to a first node N1. Specifically, the first terminal of the first parallel resonator RP1 may be coupled between the first series capacitor CS1 and the first series resonator RS1. The second terminal of the first parallel resonator RP1 may be coupled to the first node N1. Similarly, the parallel path may further include a second parallel resonator RP2, which may couple the series path of the mixed RF filter 10 to a second node N2. Specifically, the first terminal of the second parallel resonator RP2 may be coupled between the second series capacitor CS2 and the second series resonator RS2. The second terminal of the second parallel resonator RP2 may be coupled to the second node N2.

In some embodiments, the parallel path in the mixed RF filter 10 may further include a first parallel capacitor CP1, a second parallel capacitor CP2, and a third parallel resonator RP3, which may couple the series path of the mixed RF filter 10 to various nodes. As shown, the first terminal of the first parallel capacitor CP1 may be coupled between the first series resonator RS1 and the third series capacitor CS3. The second terminal of the first parallel capacitor CP1 may be coupled to the third node N3. The first terminal of the second parallel capacitor CP2 may be coupled between the second series resonator RS2 and the fourth series capacitor CS4. The second terminal of the second parallel capacitor CP2 may be coupled to the fourth node N4. The first terminal of the third parallel resonator RP3 may be coupled between the third series capacitor CS3 and the fourth series capacitor CS4. The second terminal of the third parallel resonator RP3 may be coupled to the fifth node N5.

In at least one of the above embodiments, as shown in FIG. 1, the parallel resonators RP1, RP2, and RP3 each is depicted as a single resonator. However, the present invention is not such limited, and in other embodiments, at least one of the parallel resonators RP1, RP2, and RP3 may include a plurality of series-coupled resonators.

In some embodiments, the resonator may include a surface acoustic wave (SAW) resonator, a bulk acoustic wave (BAW) resonator, or other suitable type of resonator. The mixed RF filter 10 may be configured as a low-pass, high-pass, band-pass, or band-stop filter. For instance, in the case of a high-pass filter, the capacitors and resonators in the mixed RF filter 10 may filter out lower frequency RF signals, allowing higher frequency signals (e.g., above a predetermined frequency) to pass through. Further, the predetermined frequency may be determined based on the equivalent capacitance of various capacitors and resonators. Additionally, each resonator may have a resonant frequency determined by its material and various parameters. For example, a film bulk acoustic resonator (FBAR) including a piezoelectric film may have its resonant frequency determined by the material selected for and the thickness of the piezoelectric film.

For example, a film bulk acoustic resonator (FBAR) may include a substrate, a lower electrode, a piezoelectric film, an upper electrode, and a passivation layer. The substrate may comprise materials such as silicon (Si) or quartz, providing structural support. The lower or upper electrode may be disposed on the substrate, and may generally include metals such as molybdenum (Mo), copper (Cu), aluminum (Al), gold (Au), platinum (Pt), tungsten (W), or various combinations thereof. The piezoelectric film may be disposed between the lower and upper electrodes, and may include materials such as zinc oxide (ZnO), aluminum nitride (AlN), lithium tantalate (LiTaO3, LT), lithium niobate (LN), quartz (QZ), lead titanate ($PbTiO_3$, PTO), lead zirconate titanate ($Pb[Zr_xTi_{1-x}]O_3$ ($0 \le x \le 1$), PZT), or their various combinations. The passivation layer may be disposed on the upper electrode to function as a protective film. The passivation layer may protect the structure to maintain some electrical characteristics.

In some embodiments, the resonant frequency of the FBAR may be determined by the physical dimensions and material properties of the piezoelectric film. By changing the size and/or thickness of the piezoelectric film, different resonant frequencies may be achieved. Film bulk acoustic resonators offer high frequency stability and quality factor, providing accurate output frequency. Additionally, FBARs exhibit minimal frequency changes with temperature variations, enabling operation over a wider temperature range.

In some embodiments, the mixed radio frequency filter 10 may include a first matching circuit 12 and a second matching circuit 14. The first matching circuit 12 may be coupled to the first transceiving terminal TR1, and the second matching circuit 14 may be coupled to the second transceiving terminal TR2. In this configuration, the series path and the parallel path may be connected between the first and second matching circuits 12, 14. Specifically, the first terminal of the first matching circuit 12 may be coupled to the first transceiving terminal TR1, and its second terminal may be coupled to the first series capacitor CS1 of the series path. Similarly, the first terminal of the second matching circuit 14 may be coupled to the second series capacitor CS2 of the series path, and its second terminal may be coupled to the second transceiving terminal TR2.

In an embodiment, the first series capacitor CS1 may be directly coupled to the second terminal of the first matching circuit 12. This means that the first series capacitor CS1 and the first matching circuit 12 may be directly coupled via a transmission line, with no other active or passive components in between. Similarly, the second series capacitor CS2 may be directly coupled to the first terminal of the second matching circuit 14, with no other active or passive components in between.

For example, the first matching circuit 12 may include a parallel inductor and a series capacitor, coupled between the first transceiving terminal TR1 and the first series capacitor CS1. The first matching circuit 12 matches the input impedance to a specific value (e.g., 50 ohms) to minimize reflection of the input RF signal, such that most of the input RF signal is transmitted to the mixed RF filter 10. Similarly, the second matching circuit 14 may include a parallel inductor and a series capacitor, coupled between the second transceiving terminal TR2 and the second series capacitor CS2. The second matching circuit 14 matches the output impedance to a specific value (e.g., 50 ohms) to minimize reflection of the output RF signal, such that most of the output RF signal is transmitted to the second transceiving terminal TR2. These components of the matching circuit may be examples and do not limit the invention. In other embodiments, the matching circuit may omit some components or include additional ones.

In at least one embodiment, in the series path of the mixed RF filter 10, the capacitances of the first series capacitor CS1 and the second series capacitor CS2 may be substantially the same. Similarly, the capacitances of the third series capacitor CS3 and the fourth series capacitor CS4 may be substantially the same. The equivalent capacitances of the first series resonator RS1 and the second series resonator RS2 may also be substantially the same. In other words, assuming an axis L1 is located between the third series capacitor CS3 and the fourth series capacitor CS4, the capacitors and resonators coupled in series on the left side of axis L1 (such as the first series capacitor CS1, the first series resonator RS1, and the third series resonator RS3) may be symmetrical with those on the right side of axis L1 (such as the second series capacitor CS2, the second series resonator RS2, and the fourth series capacitor CS4). Thus, axis L1 may be considered the axis of symmetry for the series path in terms of the capacitances or the equivalent capacitances of various elements.

In an embodiment, "substantially the same" means that the difference between the two components is less than ±20%, preferably less than ±10%, and more preferably less than ±5%.

In another embodiment, in the parallel path of the mixed radio frequency filter 10, the equivalent capacitances of the first parallel resonator RP1 and the second parallel resonator RP2 may be substantially the same. Similarly, the capacitances of the first parallel capacitor CP1 and the second parallel capacitor CP2 may be substantially the same. As for the axis L1, the capacitors and resonators coupled in parallel on the left side of axis L1 (such as the first parallel resonator RP1 and the first parallel capacitor CP1) may be symmetrical with those on the right side of axis L1 (such as the second parallel resonator RP2 and the second parallel capacitor CP2).

In some embodiments, the nodes N1, N2, N3, N4, and N5 may each be coupled via an inductor to a reference voltage terminal, such as ground. Alternatively, at least two of these nodes (N1, N2, N3, N4, and N5) may be coupled via a common inductor to a reference voltage terminal. The inductor may include a planar inductor, a three-dimensional inductor, or another type of inductor. In some embodiments, the nodes N1, N2, N3, N4, and N5 may each be coupled to the reference voltage terminal via a transmission line and the transmission line may provide some parasitic inductance. Alternatively, at least two of these nodes may be coupled to the reference voltage terminal via a common transmission line.

Figure 2:
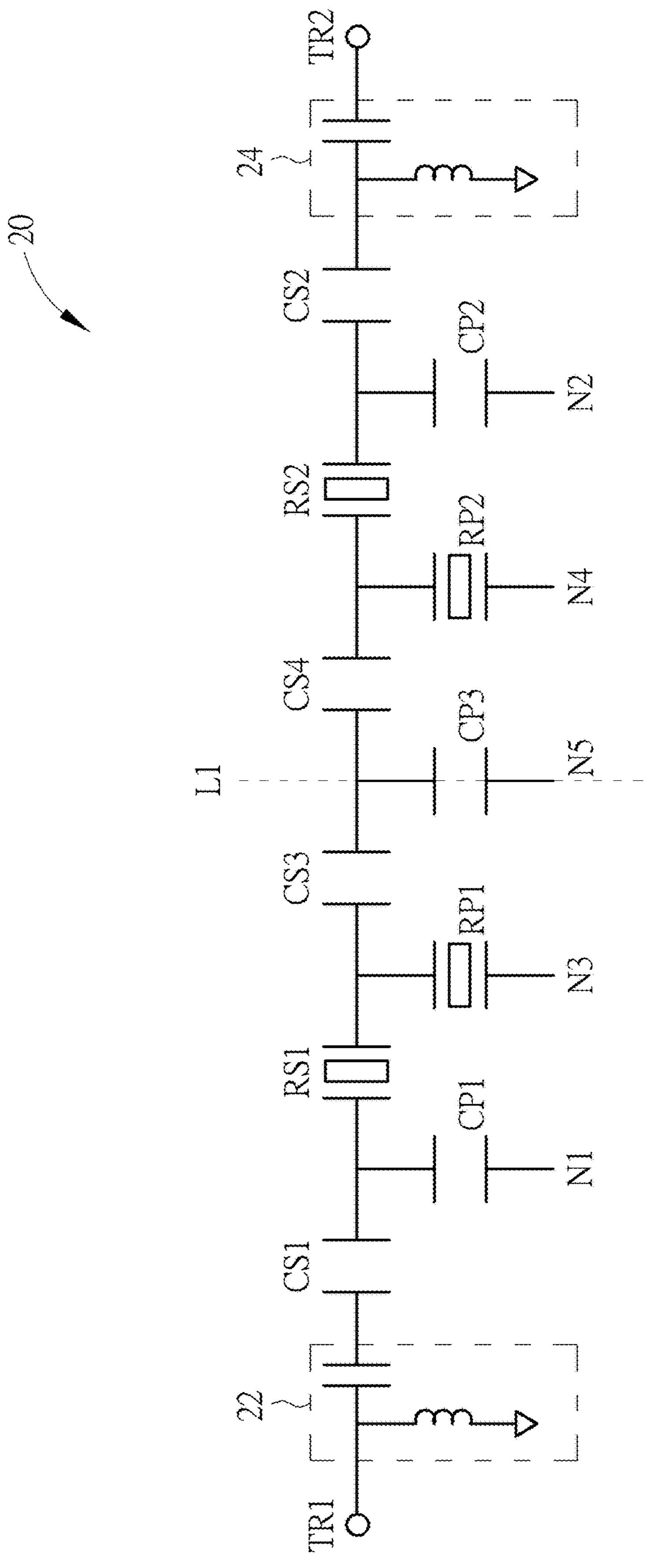
FIG. 2 is a circuit diagram of a mixed radio frequency filter according to another embodiment of the present invention.

FIG. 2 is a circuit diagram of a mixed radio frequency filter 20 according to another embodiment of the present invention. The mixed RF filter 20 is similar to the mixed RF filter 10 shown in FIG. 1. The similarities will not be described in detail, and only the main differences may be described below. In the mixed RF filter 20, the parallel path may include a first parallel capacitor CP1, which may couple the series path of the mixed RF filter 20 to the first node N1. Specifically, the first terminal of the first parallel capacitor CP1 may be coupled between the first series capacitor CS1 and the first series resonator RS1. The second terminal of the first parallel capacitor CP1 may be coupled to the first node N1. Similarly, the parallel path may further include a second parallel capacitor CP2, which may couple the series path of the mixed RF filter 20 to the second node N2. Specifically, the first terminal of the second parallel capacitor CP2 may be coupled between the second series capacitor CS2 and the second series resonator RS2. The second terminal of the second parallel capacitor CP2 may be coupled to the second node N2.

In some embodiments, the parallel path may further include a first parallel resonator RP1, a second parallel resonator RP2, and a third parallel capacitor CP3, which couple the series path of the mixed RF filter 20 to a plurality of nodes. As shown, the first terminal of the first parallel resonator RP1 may be coupled between the first series resonator RS1 and the third series capacitor CS3. The second terminal of the first parallel resonator RP1 may be coupled to the third node N3. The first terminal of the second parallel resonator RP2 may be coupled between the second series resonator RS2 and the fourth series capacitor CS4, and the second terminal of the second parallel resonator RP2 coupled to the fourth node N4. The first terminal of the third parallel capacitor CP3 may be coupled between the third series capacitor CS3 and the fourth series capacitor CS4, and the second terminal of the third parallel capacitor CP3 may be coupled to the fifth node N5.

In at least one embodiment, in the parallel path of the mixed RF filter 20, the capacitances of the first parallel capacitor CP1 and the second parallel capacitor CP2 may be substantially the same. The equivalent capacitances of the first parallel resonator RP1 and the second parallel resonator RP2 may also be substantially the same. As for axis L1, the capacitors and resonators coupled in parallel on the left side of axis L1 (such as the first parallel capacitor CP1 and the first parallel resonator RP1) and those on the right side of axis L1 (such as the second parallel capacitor CP2 and the second parallel resonator RP2) may be symmetrical.

In some embodiments, the mixed RF filter 20 may include a first matching circuit 22 and a second matching circuit 24, which may be similar to the first matching circuit 12 and the second matching circuit 14 of the mixed RF filter 10, respectively. The matching circuits will not be described in detail here. The nodes N1, N2, N3, N4, and N5 of the mixed RF filter 20 may correspond to the nodes N1, N2, N3, N4, and N5 of the mixed RF filter 10, respectively, with details may be omitted herein.

In at least one embodiment of the present invention, the mixed RF filter may include capacitors and resonators combined or mixed appropriately (such as coupled in series or in parallel), so as to be configured for a specific frequency band. In a specific embodiment, the capacitor in the series path of the mixed RF filter may be directly coupled to the matching circuit. For example, the first series capacitor CS1 may be directly coupled to the first matching circuit 12 (or the first matching circuit 22), and/or the second series capacitor CS2 may be directly coupled to the second matching circuit 14 (or the second matching circuit 24). The configuration may enable a better filtering results of the mixed RF filters.

In summary, compared to filters where the series path may include merely capacitors or merely resonators, the mixed RF filter of at least one embodiment of the present invention may utilize a combination of capacitors and resonators in the series path and further in the parallel path. Thus, the mixed RF filter of one embodiment may be desirable due to an increased overall bandwidth and thus an extended application range.

Those skilled in the art will readily appreciate that numerous modifications and alterations of the device and method may be made while retaining the teachings of the invention. Accordingly, the above disclosure should be construed as limited only by the metes and bounds of the appended claims.

What is claimed is:

1. A mixed radio frequency filter, comprising:

a first transceiving terminal;

a second transceiving terminal;

a first series capacitor;

a second series capacitor;

a first series resonator; and a second series resonator;

wherein the first series capacitor, the first series resonator, the second series resonator, and the second series capacitor are coupled in series and in the order listed between the first transceiving terminal and the second transceiving terminal; and an equivalent capacitance of the first series resonator is substantially the same as an equivalent capacitance of the second series resonator.

2. The mixed radio frequency filter of claim 1, further comprising:

a first matching circuit, comprising:

a first terminal, coupled to the first transceiving terminal; and a second terminal, coupled to the first series capacitor; and a second matching circuit, comprising:

a first terminal, coupled to the second series capacitor; and a second terminal, coupled to the second transceiving terminal.

3. The mixed radio frequency filter of claim 2, wherein the first series capacitor is directly coupled to the second terminal of the first matching circuit.

4. The mixed radio frequency filter of claim 2, wherein the second series capacitor is directly coupled to the first terminal of the second matching circuit.

5. The mixed radio frequency filter of claim 1, wherein a capacitance of the first series capacitor is substantially the same as a capacitance of the second series capacitor.

6. A mixed radio frequency filter, comprising:

a first transceiving terminal;

a second transceiving terminal;

a first series capacitor;

a second series capacitor;

a first series resonator; and a second series resonator;

a third series capacitor, comprising:

a first terminal, coupled to the first series resonator; and a second terminal; and a fourth series capacitor, comprising:

a first terminal, coupled to the second terminal of the third series capacitor; and a second terminal, coupled to the second series resonator;

wherein the first series capacitor, the first series resonator, the second series resonator, and the second series capacitor are coupled in series and in the order listed between the first transceiving terminal and the second transceiving terminal; and a capacitance of the third series capacitor is substantially the same as a capacitance of the fourth series capacitor.

7. The mixed radio frequency filter of claim 6, further comprising:

at least one first parallel resonator, comprising:

a first terminal, coupled between the first series capacitor and the first series resonator; and a second terminal, coupled to a first node; and at least one second parallel resonator, comprising:

a first terminal, coupled between the second series resonator and the second series capacitor; and a second terminal, coupled to a second node.

8. The mixed radio frequency filter of claim 7, wherein:

the at least one first parallel resonator comprises a plurality of series-coupled resonators; and the at least one second parallel resonator comprises a plurality of series-coupled resonators.

9. The mixed radio frequency filter of claim 7, further comprising:

a first parallel capacitor, comprising:

a first terminal, coupled between the first series resonator and the third series capacitor; and a second terminal, coupled to a third node; and a second parallel capacitor, comprising:

a first terminal, coupled between the fourth series capacitor and the second series resonator; and a second terminal, coupled to a fourth node.

10. The mixed radio frequency filter of claim 9, further comprising:

a third parallel resonator, comprising:

a first terminal, coupled between the third series capacitor and the fourth series capacitor; and a second terminal, coupled to a fifth node.

11. The mixed radio frequency filter of claim 10, wherein:

the first node, the second node, the third node, the fourth node and the fifth node are each coupled to a reference voltage terminal via an inductor; or at least two of the first node, the second node, the third node, the fourth node and the fifth node are coupled to a reference voltage terminal through a common inductor.

12. The mixed radio frequency filter of claim 11, wherein the reference voltage terminal is a ground terminal.

13. The mixed radio frequency filter of claim 6, further comprising:

at least one first parallel capacitor, comprising:

a first terminal, coupled between the first series capacitor and the first series resonator; and a second terminal, coupled to a first node; and at least one second parallel capacitor, comprising:

a first terminal, coupled between the second series resonator and the second series capacitor; and a second terminal, coupled to a second node.

14. The mixed radio frequency filter of claim 13, further comprising:

a first parallel resonator, comprising:

a first terminal, coupled between the first series resonator and the third series capacitor; and a second terminal, coupled to a third node; and a second parallel resonator, comprising:

a first terminal, coupled between the fourth series capacitor and the second series resonator; and a second terminal, coupled to a fourth node.

15. The mixed radio frequency filter of claim 14, further comprising:

a third parallel capacitor, comprising:

a first terminal, coupled between the third series capacitor and the fourth series capacitor; and a second terminal, coupled to a fifth node.

16. The mixed radio frequency filter of claim 15, wherein:

the first node, the second node, the third node, the fourth node and the fifth node are each coupled to a reference voltage terminal via an inductor; or at least two of the first node, the second node, the third node, the fourth node and the fifth node are coupled to a reference voltage terminal through a common inductor.

17. The mixed radio frequency filter of claim 16, wherein the reference voltage terminal is a ground terminal.

18. The mixed radio frequency filter of claim 14, wherein the first series resonator, the first parallel resonator, the second series resonator and the second parallel resonator are film bulk acoustic wave resonators.

* * * * *